United States Patent
Barber et al.

(10) Patent No.: US 6,420,202 B1
(45) Date of Patent: Jul. 16, 2002

(54) METHOD FOR SHAPING THIN FILM RESONATORS TO SHAPE ACOUSTIC MODES THEREIN

(75) Inventors: Bradley Paul Barber, Chatham; Peter Ledel Gammel, Millburn; Harold A. Huggins, Watchung; Yiu-Huen Wong, Summit, all of NJ (US)

(73) Assignee: Agere Systems Guardian Corp., Allentown, PA (US)

( * ) Notice: Subject to any disclaimer, the term of this patent is extended or adjusted under 35 U.S.C. 154(b) by 0 days.

(21) Appl. No.: 09/571,919

(22) Filed: May 16, 2000

(51) Int. Cl.[7] .............................................. H01L 21/00
(52) U.S. Cl. ........................................ 438/52; 438/113
(58) Field of Search ............................ 438/52, 61, 113, 438/114, 48, 50, 51; 331/107, 108, 116, 158; 29/25.35, 611, 594, 847

(56) References Cited

U.S. PATENT DOCUMENTS

| | | | | |
|---|---|---|---|---|
| 3,795,878 A | * | 3/1974 | Schussler ..................... 333/71 |
| 4,456,850 A | * | 6/1984 | Inoue et al. ................. 310/324 |
| 4,556,812 A | * | 12/1985 | Kline et al. ................. 310/324 |
| 4,719,383 A | * | 1/1988 | Wang et al. ................. 310/324 |
| 4,966,446 A | | 10/1990 | Huang ........................ 350/417 |
| 4,966,447 A | | 10/1990 | Huang ........................ 350/417 |
| 5,011,254 A | | 4/1991 | Edwards .................. 350/96.18 |
| 5,074,646 A | | 12/1991 | Huang ........................ 359/572 |
| 5,075,641 A | * | 12/1991 | Weber et al. ............... 331/108 |
| 5,079,130 A | | 1/1992 | Derkits, Jr. ................ 430/321 |
| 5,286,338 A | | 2/1994 | Feldblum .................... 156/643 |
| 5,412,506 A | | 5/1995 | Feldblum .................... 359/569 |
| 5,918,354 A | * | 7/1999 | Ikegami et al. ............ 29/25.35 |
| 6,131,256 A | * | 10/2000 | Dydyk et al. .............. 29/25.35 |

* cited by examiner

Primary Examiner—David Nelms
Assistant Examiner—Phuc T. Dang

(57) ABSTRACT

A process for configuring a thin film resonator to advantageously shape a desired acoustic mode of the resonator such that the electrical and acoustic performance of the resonator is enhanced. As a result of the contouring or shaping, a minimum amount of acoustic energy occurs near the edge of the resonator, from which energy may leak or at which undesired waves may be created by a desired mode. The process is used during batch-fabrication of thin-film resonators which are used in high frequency RF filtering or frequency control applications. Utilizing photolithography, the shaping can be achieved in a manner derived from the known methods used to manufacture lens arrays. Using the process, the lateral motion of acoustic waves within the resonator may be controlled and the acoustic energy of the sound wave positioned at a desired location within the resonator.

30 Claims, 5 Drawing Sheets

POLYGON

ELLIPSOID

TRAPEZOID

QUADRILATERAL

ANNULUS

STADIUM

METHOD FOR SHAPING THIN FILM
RESONATORS TO SHAPE ACOUSTIC
MODES THEREIN

BACKGROUND OF THE INVENTION

1. Field of the Invention

The present invention relates to the field of radio frequency (RF) electrical filters, frequency control elements and oscillators having resonators and, more particularly, to a process for structuring a thin film resonator to advantageously shape the mode of the acoustic resonator such that the electrical and acoustic performance of the resonator are enhanced.

2. Description of the Related Art

Thin film resonators (TFRs) are thin film acoustic devices which can resonate in the radio frequency to microwave range, for example, 0.5 to 5 Gigahertz (GHz), in response to an electrical signal. A typical TFR has a piezoelectric film between a first electrode and a second electrode which apply an electric field to the piezoelectric film. The film is made of a piezoelectric crystalline material, such as zinc oxide, aluminum-nitride (AlN) or other piezoelectric crystalline material, which exhibits a piezoelectric effect. The piezoelectric effect occurs when the piezoelectric material expands or contracts in response to an electric field applied across the piezoelectric material, for example by the first and second electrodes, or produces charge or current in response to mechanical stress or strain applied to the piezoelectric material. The mechanical resonance frequency of the film, is defined for a film of uniform thickness as the acoustic velocity (v) in the film divided by two (2) times the thickness (t) of the film or $f_r = v/2t$. If an RF source is used to apply an alternating electric field of variable frequency to a piezoelectric film, as the frequency of the source matches the mechanical resonance frequency of the film, a pronounced enhancement in the mechanical motion of the piezoelectric film will occur. Correspondingly, the piezoelectric material will produce a maximum amount of current at this resonance frequency because of the mechanical motion which is large in magnitude. Piezoelectric film is useful as an element in electrical filters, oscillators, or frequency control circuits because it yields different amounts of current at different frequencies. If the resonating or transducing material is magnetostrictive or electrostrictive (i.e., CoFeTaZr alloys (cobalt iron tantalum zirconium) or PMN (Lead Magnesium Niobate)), electric filters can also be made using mechanical resonators because, as in piezoelectric material, an RF source will cause the resonating material to mechanically move.

Boundaries at the upper and lower surfaces of a piezoelectric material may be imposed to reflect acoustic waves excited in the material such that a sympathetic vibration (i.e., resonance) occurs at a desired frequency. For example, a material can be polished with two flat interfaces separated by just enough material (for example, half of a wavelength at the propagation velocity of sound through the material) such that the transit time of a wave back and forth in the material occurs at a desired period. Such resonators can be made from bulk piezoelectric crystals which are polished to the desired dimensions. However, there is a practical limit to the highest frequency achievable in this manner, which frequency occurs when polishing reduces the material to thicknesses so small that the material cannot be handled easily.

TFRs can be used at radio frequency (RF) because piezoelectric films can be made thin, for example at higher frequencies, such as 0.5–10 GHz, the piezoelectric film can be between 0.4 and 8 microns in thickness. Piezoelectric resonators needed for these higher frequency applications can be made by using techniques similar to those used to manufacture integrated circuits. The TFR structure can be formed on the substrate, such as a silicon (Si), Gallium Arsenide (GaAs) or other semiconductor substrate, for monolithic integration purposes, such as integration with active semiconductor devices. If the TFR has acoustic reflecting layer(s) as explained below, the acoustic reflecting layer(s) are formed on the substrate followed by the second electrode which is formed on the reflecting layer(s). If there are no acoustic reflecting layers, then the second electrode is formed on the substrate, for example using chemical vapor deposition (CVD) or sputtering. See, Kern & Vossen, *Thin Film Processes*, Vols. I and II, Wiley & Sons. The piezoelectric film is then formed on the second electrode, and the first electrode is formed on top of the piezoelectric film, for example using chemical vapor deposition (CVD) or sputtering.

If such a piezoelectric film is simply deposited on a silicon wafer, a large portion of the sound which is produced may leak into the silicon and be lost due to the poor acoustic reflection between the piezoelectric material and the silicon. In order to impose a good reflecting interface in this case, a portion of the silicon substrate is removed from under the device, yielding a membrane type TFR device. Alternatively, an acoustic mirror may be manufactured by repeatedly causing small reflections from many interfaces between different materials and ensuring all the reflections sum constructively. For example, in the resonator 10 shown in FIG. 1, as movement of a sound wave from the upper layer 11 of aluminum nitride (AlN) to the first layer 12 of silicon dioxide occurs ($SiO_2$), some of the energy of the wave is reflected instead of completely passing through the first layer 11, due to the different densities and sound propagation speeds of each layer. At the interface between the silicon dioxide layer 12 and the next aluminum nitride layer 13, another reflection occurs. However, each time the sound wave is reflected, it is constructively summed with the reflected sound wave which exists in the upper layer 11. To ensure that these reflections sum constructively, each mirror layer should have a thickness of exactly one quarter of the wave length of sound at the desired frequency. In this manner, if one half of the energy of the imposed wave is reflected at each interface, once the sound wave has passed through twelve layers, for example, all of the wave except 1 part in 1,000 of the sound wave will be reflected. This non reflected portion represents the amount of sound wave lost from the resonator.

To resonate at typical RF frequencies such as 2 GHz, an AlN film will be typically 2.5 microns thick, and the electrodes may be 300 microns across for an optimum match to a 50 Ohm circuit. Thus, the ratio of the material thickness to lateral dimension is small, and the sound energy is not laterally well confined. Detrimental interactions between different types of acoustic waves (modes) and the edge of the resonator occur, and large fields at the edge of the resonator may create unwanted motions in the resonator. Any of these effects remove energy from the desired vibration and degrade resonator quality.

SUMMARY OF THE INVENTION

The present invention is a process for lithographically shaping a resonator such that a predominance of acoustic energy is provided at desired locations within the resonator. For example, by providing a resonator which is shaped to be constructed thicker in its middle, the resonant mode shape becomes changed such that the resonant mode will also be greater at the middle of the resonator. The mode shape is seen when an instantaneous "snapshot" of a standing resonant wave is taken; it shows where a response amplitude of motion is large and where it is small. As a result of increasing the thickness of the resonator at the middle and thus changing the mode shape, the fractional amount of energy which is converted to unwanted vibrations by the edge of the resonator is reduced. This resonator lithographic shaping process can be used during batch-fabrication (i.e., where multiple thin film resonators are manufactured on a continuous silicon substrate of thin-film resonators which are used in high frequency applications.) In certain embodiments, the shaping is achieved using photolithography. Photo-definable resists can be positioned over areas of the substrate that are not meant to be removed. The resist itself will be removed at a rate such that it may only protect the substrate beneath it until the resist is removed. Material removal or an etching process can be used to transfer a shaped pattern in a resist to a shaped pattern in the piezoelectric material being removed.

BRIEF DESCRIPTION OF THE DRAWINGS

The present invention may be more readily understood by one skilled in the art with reference being had to the following detailed description of the preferred embodiments thereof, taken in conjunction with the accompanying drawings wherein like elements are designated by identical reference numerals throughout the several views, and in which.

DETAILED DESCRIPTION OF THE PREFERRED EMBODIMENTS

Figure 1:
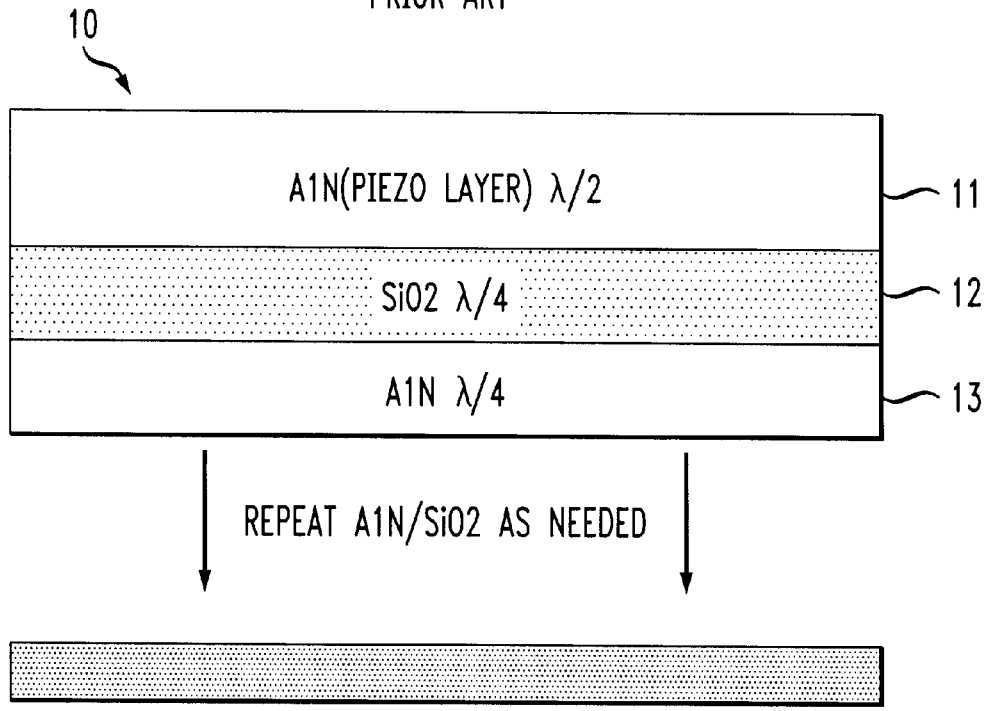
FIG. 1 is an illustration of a resonator constructed on an acoustic mirror with regular flat geometry in accordance with the prior art.
Figure 2:
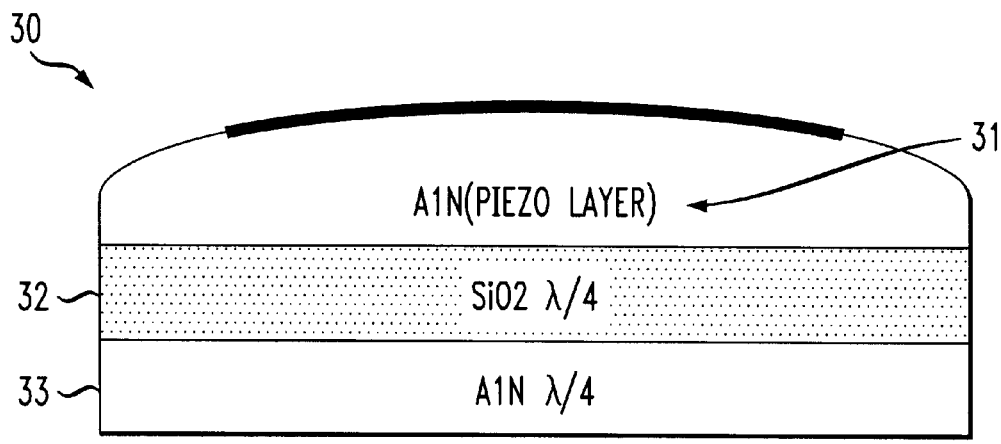
FIG. 2 is an exemplary illustration of a domed piezo resonator on an acoustic mirror according to the present invention.

FIG. 2 is an exemplary illustration of a domed piezo resonator 30 according to the present invention. In the resonator 30 shown in FIG. 2, the AlN 31 (piezo layer) is domed and layers of $SiO_2$ 32, and AlN 33 are positioned beneath the domed layer of AlN 31 to act as an acoustic mirror. At lower frequencies, quartz crystals have mechanically polished domes and are also mechanically manufactured in order to perform improved filtering and frequency selection. The resonator 30 shown in FIG. 2 operates at high frequencies, where a fundamentally different preparation sequence is used. First, thin films are deposited on silicon (in a manner similar to that used when making computer chips) and all of the manufacturing steps are performed utilizing photo lithographic and etching techniques, such that a domed acoustic resonator 30 which advantageously guides the acoustic waves to the center of the resonator is obtained.

In the resonator according to the present invention, if a sound wave is introduced into the resonator, the sound wave will enter, bounce off the opposing side and return to the point of origin. If the sound wave is entered into the resonator in phase, the sound wave will sum constructively with any sound wave which is already present. This is a simplified view of sympathetic vibration (i.e., resonance). Conversely, if the sound wave is entered into the resonator out of proper phase, the sound wave may destructively interfere with any sound wave which is already present. In the present invention, the time required for a sound wave to propagate, hit an opposite surface of a layer and return (i.e., a reflection) is relevant in determining resonance and destructive interference. If a layer thickness is increased, it takes longer for the sound wave to propagate and return. In a thinner layer, on the other hand, the sound wave propagates and reflects at an earlier time.

Piezoelectric films are utilized for electronic filtering because their electrical properties exhibit useful characteristics at the mechanical resonance frequency of piezoelectric material. In such filters, the reduction of any signal degradation due to energy loss is vital. An example of loss in such a device is the creation of unwanted lateral excitations (drawing energy from the desired resonance mode) which is known to occur at the edge of the resonator. It is thus important to control the mode shapes in piezoelectric devices to enhance their electrical performance.

The resonator can be shaped using techniques similar to those used in current microlens fabrication processes. For example, the following patents, all of which are expressly incorporated herein by reference as if fully set forth herein, provide examples of such micro lenses and microlens arrays. For instance, U.S. Pat. No. 5,079,130 to Derkits, Jr. describes a refractive micro lenses process using photolithography and reactive ion etching. U.S. Pat. No. 5,286,338 to Feldblum, et al. describes the production of diffractive micro-optic arrays using thin film deposition. U.S. Pat. No. 5,011,254 to Edwards, et al. describes a process for manufacturing micro lenses directly on the end of optical fibers for coupling applications. Lastly, to U.S. Pat. No. 5,412,506 to Feldblum, et al. describes the fabrication of diffractive micro-optics using a multilevel etching process. Micro lenses are commercially available from companies such as Corning, Nippon Sheet Glass, and United Technologies.

A lithographic method for making refractive micro lenses is disclosed in U.S. Pat. No. 5,079,130 and is improved upon in U.S. Pat. No. 5,286,338. A cylindrical lenses may be made using the process described in U.S. Pat. No. 5,286,338. In this case, however, long rectangles (rather than cylinders) of resist are used.

Diffractive microlens arrays are made by approximating an ideal diffractive optical surface profile with a series of planar levels; this produces a staircase effect. The more levels used, the greater the diffraction efficiency. An 8-level structure has a theoretical maximum diffraction efficiency of 95%, versus 99% for a 16-level structure. A series of lithographic exposures and reactive ion etching are used to fabricate these structures.

Figure 3:
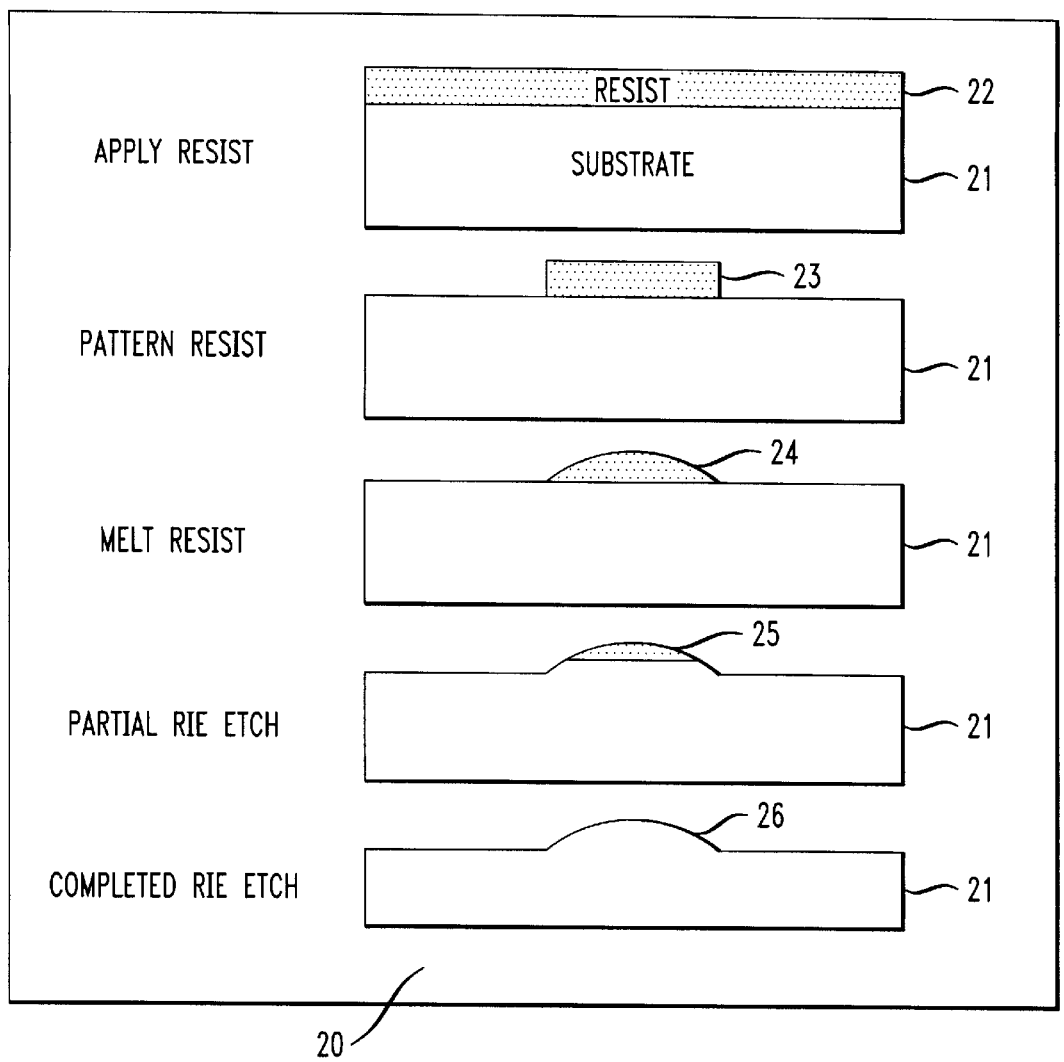
FIG. 3 is an illustration of the process steps for producing a domed piezo resonator according to the present invention.

FIG. 3, is an illustration of the process steps for producing a resonator 20 in accordance with the present invention. This process begins by coating a substrate 21 with photo resist 22 which is exposed and developed into "hockey-puck" cylinders 23. For example, a photo resist is patterned into cylinders 23 and using a heating schedule (heat at 80° C., then 150° C. for 10 minutes at each temperature, for example), the photo resist cylinders 23 are melted into dome shaped "drops 24." Next, reactive ion etching (RIE) is used to transfer the resist lenses into the substrate material. Partial resist 25 is obtained prior to completion of the RIE. Upon complete removal of the resist, removal of the substrate will also begin. Utilizing an etching process (for example, reactive ion etching, wet chemistry or focus ion beam milling (FIB)), the resist 25 and material 21 are then etched at the required rates (as set forth in the etching process) such that the final structure 26 possesses the desired amount of doming, contouring or shaping for guiding the acoustic waves to the center of the resonator. Reactive ion etching is the removal of material in a chamber into which reactive gases are introduced to chemically attack the surface to be removed. The removal process in FIB is enhanced by bombarding the surface of the material with high energy ions from an ionized plasma. This is accomplished by creating charged ions (typically chemically-inert ions) and accelerating the ions toward the material to be removed. Wet chemistry uses known chemicals to dissolve and "react away" material from a substrate in a wet chemical bath. For example, aluminum and many other materials can be chemically etched in hydrofluoric acid. Chemical mechanical polishing (CMP) uses a very fine polishing slurry and a polishing pad, combined with a chemical reaction to remove material from the substrate. If the removal rate of the material and resist is equal in any of the above material removal processes, the initial pattern which existed in the resist will be exactly reproduced in the material beneath the resist. If, however, the resist is removed at a rate which is half the rate of the removal of the underlying material for example, the initial pattern will be scaled as it is transferred to the underlying material. In this case, any step or dome height which existed in the resist will be doubled since the underlying material was etched at twice the etching rate of the resist. The type of material removal process used and the parameters of the process can be changed during the material removal stage to vary the relative etch rates of the resist and the underlying material such that the initial resist shape is tailored to a desired final shape. For example, change the type of reactive gas used during RIE, change the chemicals in which the wet etch is performed or change the type of chemicals used to perform the CMP. This provides greater flexibility during etching, and permits the creation of a broader range of final shapes.

Alternatively, the photo resist 22 may be exposed to the vapors of a suitable resist solvent such as, for example, propylene glycol methyl ether acetate (PGMEA) to form the resist drops. Here, the resist cylinders 23 are exposed to the vapors of the heated solvent in an evacuated heated chamber. As the vapors of the solvent are absorbed by the resist cylinders 23, the temperature at which the material flows is lowered, and the resist cylinders 23 flow to form the resist layer 24. The use of vapor advantageously permits the use of much thinner resist layers. Resist thicknesses of 0.4 $\mu$m and greater can be used, as opposed to the several microns required using the melting technique. As a result, a substantial reduction in subsequent etching times is achieved.

The resonator may be shaped such that it possesses low symmetry (when view from above). Generally, a circular resonator (for example) possesses the highest symmetry, along with a more pronounced level of constructive interference of laterally traveling waves. On the other hand, a non radially shaped resonator (a hexagonal shaped resonator, for example) exhibits a lower level of constructive interference. Consequently, a resonator having a highly symmetric structure and a resonator having a low symmetric structure should be used to obtain a large constructive interference or a low constructive interference, respectively.

In certain cases, it is desirable for lateral waves within the resonator to reflect in phase, and thus sum constructively. However, there are instances where it is desirable for such lateral waves to reflect at random phases (i.e., by constructing resonators having hatched scalloped, jagged or wavy edges, for example). This may prove advantageous in that it is possible to cause the sound waves to interfere in a non uniform manner, and thus reduce constructive interference.

In another alternative embodiment of the invention, dishing instead of doming may be preferred for applications where thicker boundary regions produce a mode with pronounced vibration at the resonator's edge. In other alternative embodiments, multiple domes within a resonator, washboarding with multiple high and low rows, or radial patterns (for example, a target with uniform or nonuniform periodicity and height) may be preferred. The shaping may be performed on any part of the device: the substrate, reflecting layers, piezoelectric resonator or the metallic electrodes. As a result of the shaping, the lateral motion of acoustic waves within the resonator may be controlled. This permits accentuation of the acoustic energy or the sound wave at desired locations within the resonator. This advantageously affects the performance of the resonator when used as a frequency selective device such as an oscillator or filter.

In order to store energy differently in different parts of the resonator of FIG. 2, the geometry of the resonator may be changed. As a result, the energy of the sound wave will be concentrated in the middle of the dome at certain frequencies due to the sound wave being propagated and reflected at the correct time such that the energy is constructively summed. At the outer edges of the resonator, where the dome is thinner, however, the energy is less than optimally summed at identical frequencies because the wavelength is less than ½ lambda. As a result, a greater amount of energy is concentrated at the center of the resonator as a result of the less than optimal summing of the energy at the edges of the resonator. Naturally, one skilled in the art will appreciate that the foregoing is a simplified view of resonance phenomena of complicated geometries, but illustrates that energy can be concentrated in certain parts of a resonator depending on its construction and the frequency of operation.

Figure 4:
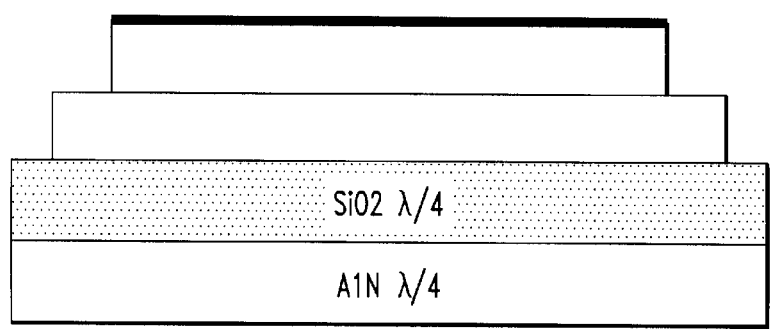
FIG. 4 is an illustration of a step-wise shaped piezo resonator on an acoustic mirror according to the present invention.
Figure 7:
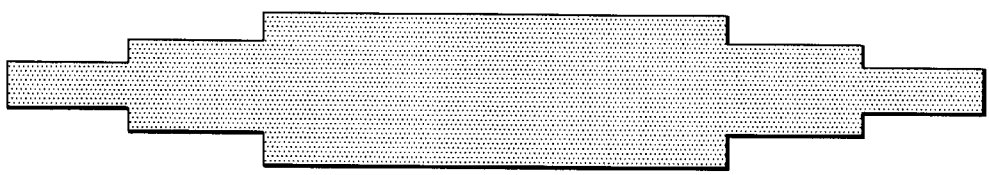
FIG. 7 is a cross sectional illustration of a doubly step-wise shaped resonator according to the invention.

Alternatively, multiple layers of resist can be provided such that multiple etchings are performed to produce a resonator having a stepped shaping. FIG. 4 is an illustration of a step-wise shape piezo resonator according to the present invention. FIG. 7 is a cross sectional illustration of a doubly step-wise shaped piezo electric resonator. The step-wise shaped piezo resonator shown in FIG. 4 includes silicon dioxide layers and aluminum nitride layers which acts as an acoustic mirror. Utilizing the photolithographic processes, it is possible to approximate a dome which has a number of small steps. At times, it is easier to construct discrete steps and achieve benefits similar to those obtained in a domed piezo resonator. With a step-wise shaped piezo, it is possible to perform a more conventional lithography in multiple steps. Advantageously, the step-wise shaped piezo resonator may also split the mode into a multiplicity of modes to thereby add desired spectral features to the electrical response of the resonator. The doubly step-wise shaped resonator shown in FIG. 7 may also be constructed as a free standing membrane. Alternatively, the top layer of the acoustic mirror or a second electrode of the resonator may be constructed in a trenched manner such that the interface between the resonator and mirror is lowered at desired locations.

Figure 5:
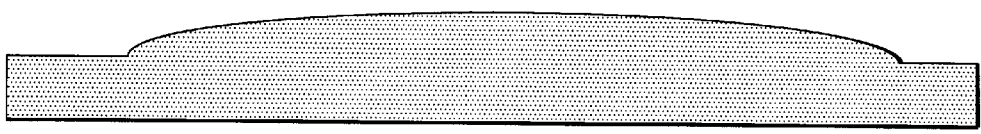
FIG. 5 is a cross sectional illustration of a plano-convex shaped resonator according to the invention.
Figure 6:
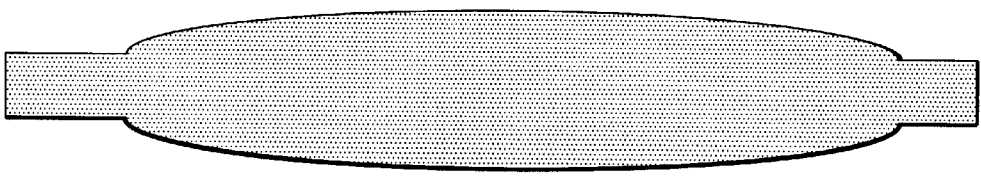
FIG. 6 is a cross sectional illustration of a doubly-convex shaped resonator according to the invention.
Figure 8:
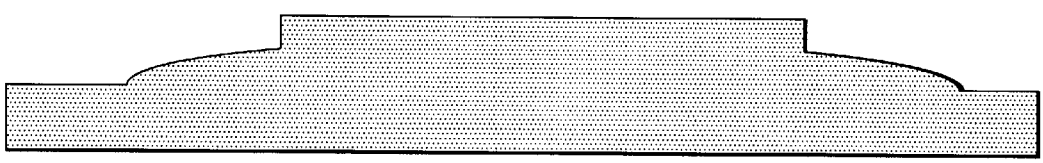
FIG. 8 is a cross sectional illustration of a resonator having features of both of the resonators of FIG. 6 and FIG. 7.
Figure 9:
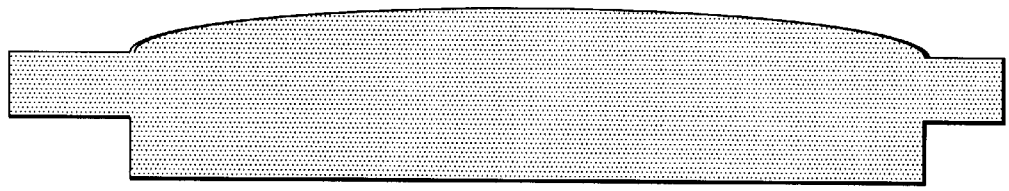
FIG. 9 is an alternative cross sectional illustration of a resonator having features of both of the resonators of FIG. 5 and FIG. 7.
Figure 10A:
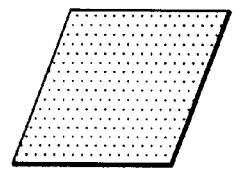
FIGS. 10(a) through 10(f) are top views of various resonators having different geometries and symmetries acceding to the invention.
Figure 10B:
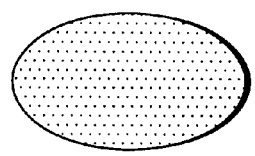
Figure 10C:
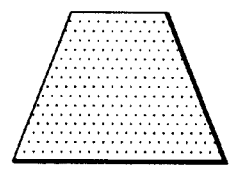
Figure 10D:
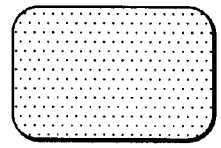
Figure 10E:
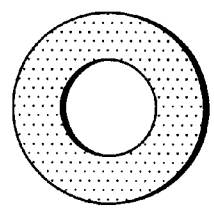
Figure 10F:
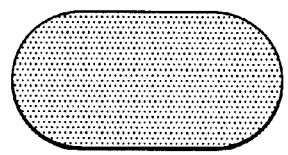

It is also advantageous to use the photolithographic processes to shape resonators such that various shapes are achieved, for example a plano-convex shaped resonator (as shown in FIG. 5), or a doubly convex shaped resonator (as shown in FIG. 6). It is also possible to utilize the etching processes to shape the resonators such that they possess the combined features of the various resonators (see for example, FIGS. 8 and 9). In addition to shaping resonators on mirrors, it is also desirable to shape freestanding membrane resonators and utilize them in broader band filtering applications.

FIGS. 10(a) through 10(f) show top views of other contemplated embodiments of the present invention. These lower symmetry embodiments are shaped via photolithography or etching such that they focus sound waves in a manner which is advantageous for a particular application (i.e., repositioning the location of sound waves within resonators, for example). In a conventional circular shaped resonator, laterally moving sound waves propagate and reflect symmetrically. In such a resonator, at certain frequencies these waves can arrive in the middle of the resonator at the same time (in phase). In contrast, the lower symmetry shaped resonators according to the invention do not cause the sound waves to propagate and reflect to the middle of the resonator in phase. Instead, the lower symmetry shaped resonators may cause the sound waves to reflect in a chaotic manner (random) or cause large amplitude vibrations at locations away from the resonator's center. As a result, an advantageous repositioning of the lateral propagation of the wave is achieved.

The mode shape imposed by the embodiments shown in FIGS. 10(a) through 10(f) changes as the operating frequency of the resonator is changed, due to coupling between the direction of the waves in the resonator and the nonparallel edges of the resonator. This change in mode shape can result in a desired frequency dependant change in the impedance of the resonator. The polygonal and trapezoidal embodiments shown in FIGS. 10(a) and (c) possess mode shapes which are generally consistent with the symmetry of the resonator boundaries. The quadrilateral embodiment shown in FIG. 10(d) possesses a mode shape which comprises waves disposed in lines which are parallel to the resonator edges, with perturbations (i.e., a variations of the mode shape) which occur as a result of the rounded comers. The ellipsoidal embodiment shown in FIG. 10(b) possesses a mode shape which comprises interposed ellipses and hyperbolas. The annulus embodiment shown in FIG. 10(e) possess a circular radial mode shape which is interposed with a sinusoidal angular pattern. The stadium embodiment shown in FIG. 10(f) possesses a chaotic shape.

Figure 11A:
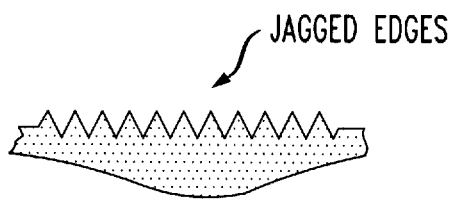
FIGS. 11(a) through 11(d) are top views of various resonators having different edge configurations according to the invention.
Figure 11B:
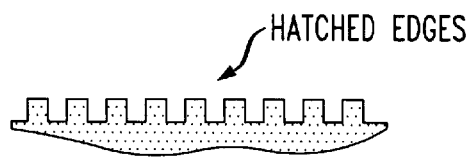
Figure 11C:
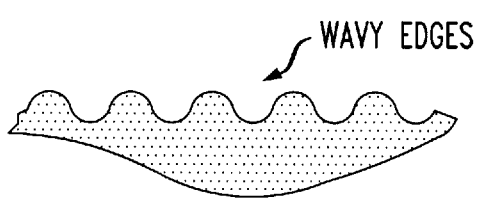
Figure 11D:
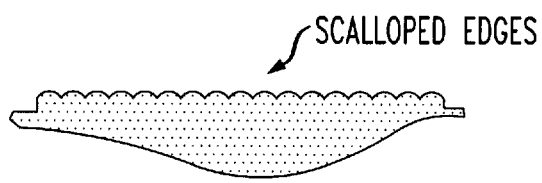

Resonators having the different edge configurations shown in FIGS. 11(a) through 11(c) (i.e., hatched scalloped, jagged or wavy edges, for example) can be constructed and used to cause lateral waves within the resonator to reflect at random phases. This may prove advantageous in that it is possible to cause the sound waves to interfere in a non uniform manner, and thus reduce constructive interference (i.e., reduce reflection coherency). This reduction in reflection coherency occurs in a manner which is analogous to "roughing" the walls of a room to reduce unwanted coherent reflections.

While the invention has been particularly shown and described with reference to a preferred embodiment thereof, it will be understood by those skilled in the art that various changes in form and details may be made therein without departing from the spirit and scope of the invention.

What is claimed is:

1. A method for photolithographic shaping of high frequency thin film acoustic resonators, comprising the steps of:

utilizing one of a heating schedule and vapor cycle to shape a masking material into a predetermined physical structure; and removing material from the resonator to shape the acoustic resonator such that acoustical modes within the acoustic resonator are shaped.

2. The method of claim 1, wherein said removing step comprises:

removing material from at least one of one electrode, underlying layers and transducing material-of the resonator.

3. The method of claim 2, wherein the transducing material is one of a piezoelectric, a electrostrictive, and a magnetostrictive material.

4. The method of claim 1, wherein said material removal comprises one of etching and polishing the resonator.

5. The method of claim 4, wherein said etching of the resonator comprises doming and dishing the resonator.

6. The method of claim 4, wherein said etching of the resonator comprises doming and step shaping the resonator.

7. The method of claim 4, wherein said etching of the resonator comprises dishing and step shaping the resonator.

8. The method of claim 1, wherein said predetermined heating schedule comprises the steps of:

subjecting the material to heat of at least a first temperature; and subjecting the material to heat of at least a second temperature.

9. The method of claim 1, wherein the first temperature is 80° C. and the second temperature is 150° C.

10. The method of claim 8, wherein said subjecting steps are performed for ten minutes, respectively.

11. The method of claim 1, further comprising the steps of:

repeating the steps of utilizing the heating schedule to pattern material into a shaped resonator; and etching the resonator to obtain at least one of a doming, contouring and a stepped shaping of the resonator.

12. The method of claim 1, wherein the resonator is one of a polygonal shaped, stadium shaped, circular shaped, elliptical shaped and annuloidal shaped resonator.

13. The method of claim 1, further comprising the steps of:

repeating the steps of utilizing a vapor cycle to form a structure of masking material on top of the resonator into a profile; and etching the resonator to obtain at least one of a doming, contouring and a stepped shaping of the resonator based on the structure of masking material.

14. The method of claim 1, wherein a mode shape of the resonator has a maximum displacement at a center of the resonator.

15. The method of claim 1, wherein the masking material is a photo resist and said vapor cycle comprises the step of:

exposing the material to a heated resist solvent to lower a temperature at which the material begins to flow.

16. The method of claim 15, wherein the resist solvent is propylene glycol methyl ether acetate.

17. The method of claim 1, wherein edges of the resonator are one of hatched shaped, scalloped shaped, jagged shaped and wavy shaped.

18. The method of claim 4, wherein said etching is one of reactive ion etching, focused ion beam etching, chemical mechanical polishing and wet chemistry.

19. The method of claim 18, further comprising the step of:

varying etching parameters during material removal to vary removal rates of the masking material and resonator such that the resonator has a different shape than the masking material.

20. The method of claim 19, wherein the etching parameters are one of a reactive gas used during reactive ion etching, chemicals in which wet chemistry etching is performed and chemicals used to polish the resonator.

21. A method for lithographic shaping of thin film resonators to have resonant modes, comprising the steps of:

shaping masking material into a profile; and etching the resonator based on the masking material to shape the resonator such that the resonant modes within the resonator are shaped.

22. The method of claim 1, wherein the predetermined physical structure is a cylindrical shape.

23. A method for fabricating a device comprising a thin resonator, the method comprising:

forming a piezoelectric film over a substrate;

wherein the film has a shape selected from a group consisting of polygonal, elliptical, trapezoidal, quadrilateral, annular, and stadium.

24. The Method of claim 23, wherein the forming step comprises providing the piezoelectric film and treating the provided piezoelectric film to form the shape.

25. The method of claims 23, wherein the shape is polygonal.

26. The method of claims 23, wherein the shape is elliptical.

27. The method of claims 23, wherein the shape is trapezoidal.

28. The method of claims 23, wherein the shape is quadrilateral.

29. The method of claims 23, wherein the shape is annular.

30. The method of claims 23, wherein the shape is stadium.

* * * * *